(12) United States Patent
Chen et al.

(10) Patent No.: US 10,304,679 B2
(45) Date of Patent: May 28, 2019

(54) METHOD OF FABRICATING A MASK

(71) Applicants: UNITED MICROELECTRONICS CORP., Hsin-Chu (TW); Fujian Jinhua Integrated Circuit Co., Ltd., Quanzhou, Fujian Province (CN)

(72) Inventors: Chieh-Te Chen, Kaohsiung (TW); Hsien-Shih Chu, Kaohsiung (TW); Cheng-Yu Wang, Kaohsiung (TW)

(73) Assignees: UNITED MICROELECTRONICS CORP., Hsin-Chu (TW); Fujian Jinhua Integrated Circuit Co., Ltd., Quanzhou, Fujian Province (CN)

( * ) Notice: Subject to any disclaimer, the term of this patent is extended or adjusted under 35 U.S.C. 154(b) by 0 days.

(21) Appl. No.: 15/876,226

(22) Filed: Jan. 22, 2018

(65) Prior Publication Data

US 2018/0226250 A1    Aug. 9, 2018

(30) Foreign Application Priority Data

Feb. 3, 2017    (CN) .......................... 2017 1 0063695

(51) Int. Cl.
*H01L 21/033*   (2006.01)
*H01L 21/762*   (2006.01)

(52) U.S. Cl.
CPC ...... *H01L 21/0335* (2013.01); *H01L 21/0332* (2013.01); *H01L 21/0337* (2013.01); *H01L 21/76224* (2013.01)

(58) Field of Classification Search
CPC ............. H01L 21/0335; H01L 21/0337; H01L 21/0332; H01L 21/76224; H01L 21/308–21/3088; H01L 21/31144; H01L 31/32; H01L 21/32139; H01L 21/467; H01L 21/475; H01L 21/469–21/47576; H01L 21/311; H01L 21/76; H01L 21/4763; H01L 21/6224; H01L 29/0649; H01L 21/3081; H01L 21/3065; H01L 21/02164; H01L 21/3086; H01L 21/0217; H01L 21/32; H01L 21/027
See application file for complete search history.

(56) References Cited

U.S. PATENT DOCUMENTS

| 5,930,644 | A  | * | 7/1999 | Tsai ................... H01L 21/76224 257/E21.244 |
| 7,118,986 | B2 | * | 10/2006 | Steigerwalt ......... H01L 21/3081 438/424 |
| 7,202,174 | B1 |   | 4/2007 | Jung |
| 7,745,338 | B2 | * | 6/2010 | Cha ..................... H01L 21/0337 438/424 |

(Continued)

*Primary Examiner* — William F Kraig
*Assistant Examiner* — Khatib A Rahman
(74) *Attorney, Agent, or Firm* — Winston Hsu

(57) ABSTRACT

A method of fabricating a mask includes providing a substrate. A first material layer is disposed on the substrate. Then, the first material layer is partly removed. A second trench is formed between the remaining first material layer. The second trench includes a height. Later, a second material layer is formed to conformally fill in the second trench. The second material layer includes a thickness. The thickness of the second material layer equals the height of the second trench. Finally, part of the second material layer is removed, and the remaining second material layer and the remaining first material layer comprise a second mask.

7 Claims, 7 Drawing Sheets

(56) References Cited

U.S. PATENT DOCUMENTS

| | | | |
|---|---|---|---|
| 8,101,520 B2* | 1/2012 | Kim | H01L 21/76838 438/674 |
| 2007/0111467 A1* | 5/2007 | Kim | H01L 21/3065 438/424 |
| 2007/0148968 A1* | 6/2007 | Kwon | H01L 21/0337 438/671 |
| 2008/0124931 A1* | 5/2008 | Lee | H01L 21/0332 438/692 |
| 2011/0140229 A1* | 6/2011 | Rachmady | H01L 21/76224 257/506 |

* cited by examiner

METHOD OF FABRICATING A MASK

BACKGROUND OF THE INVENTION

1. Field of the Invention

The present invention relates to a method of fabricating a mask, and more particularly to a method of fabricating a mask having a flat surface.

2. Description of the Prior Art

Semiconductor devices are used in a large number of electronic devices, such as computers and cell phones. Semiconductor devices comprise integrated circuits that are formed on semiconductor wafers by depositing thin films of many types of material over the semiconductor wafers, and patterning the thin films of material to form the integrated circuits.

Shallow trench isolation (STI) is one conventional approach frequently used to reduce leakage currents for integrated circuits. STI entails the creation of a STI trench between adjacent transistors, which is then filled with a dielectric material. The dielectric material (for example, silicon dioxide) provides a barrier which impedes the flow of leakage current between the transistors on opposite sides of the STI trench.

When forming the STI trench, a mask layer is formed on the substrate to define the position of the STI trench. The top surface of the mask layer is often uneven, meaning the STI trench will have a size different from the original design.

SUMMARY OF THE INVENTION

According to a preferred embodiment of the present invention, a method of fabricating a mask layer comprises providing a substrate, wherein a first material layer is disposed on the substrate. Next, a first mask is formed to cover the first material layer, wherein the first mask includes numerous sub-masks, and a first trench is disposed between sub-masks adjacent to each other. Later, part of the first material layer is removed by using the first mask as a first protective mask to form a second trench between the part of the first material layer which is not removed, wherein the second trench and the first trench form a third trench, the second trench has a height, and the third trench has two sidewalls and a bottom. Subsequently, a second material layer is formed to conformally fill in the third trench, wherein the second material layer includes a thickness, and the thickness equals the height. Finally, part of the second material layer is removed, and the second material layer which is not removed and the first material layer which is not removed form a second mask.

A method of fabricating a mask according to a second preferred embodiment comprises providing a substrate, wherein a first material layer covers the substrate. Next, a first mask is formed to cover the first material layer, wherein the first mask includes numerous sub-masks, a first trench is disposed between sub-masks adjacent to each other, and the first trench comprises two sidewalls and a bottom. Then, a second material layer is formed to conformally fill in the first trench, wherein the second material layer is made of a material different from the first material layer. Next, a mask material is formed to fill in the first trench. After that, the second material layer contacting the sidewalls of the first trench is removed to form numerous second trenches, and the second material layer which is not removed covers the bottom of the first trench. Later, after forming the second trenches, part of the first material layer is removed by using the mask material and the first mask as a first protective mask to form a second mask. Subsequently, the mask material and the first mask are removed. Finally, the second material layer is removed entirely.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 6 depict a method of fabricating a mask layer according to a first preferred embodiment of the present invention, wherein:
FIG. 1 shows a substrate covered by a photoresist;
FIG. 2 is a fabricating stage following FIG. 1;
FIG. 3 is a fabricating stage following FIG. 2;
FIG. 4 is a fabricating stage following FIG. 3;
FIG. 5 is a fabricating stage following FIG. 4;
and
FIG. 6 is a fabricating stage following FIG. 5.
FIG. 7 to FIG. 12 depict a method of fabricating a mask layer according to a second preferred embodiment of the present invention, wherein
FIG. 7 shows a substrate covered by sub-masks;
FIG. 8 is a fabricating stage following FIG. 7;
FIG. 9 is a fabricating stage following FIG. 8;
FIG. 10 is a fabricating stage following FIG. 9;
FIG. 11 is a fabricating stage following FIG. 10;
and
FIG. 12 is a fabricating stage following FIG. 11.

DETAILED DESCRIPTION

Figure 1:
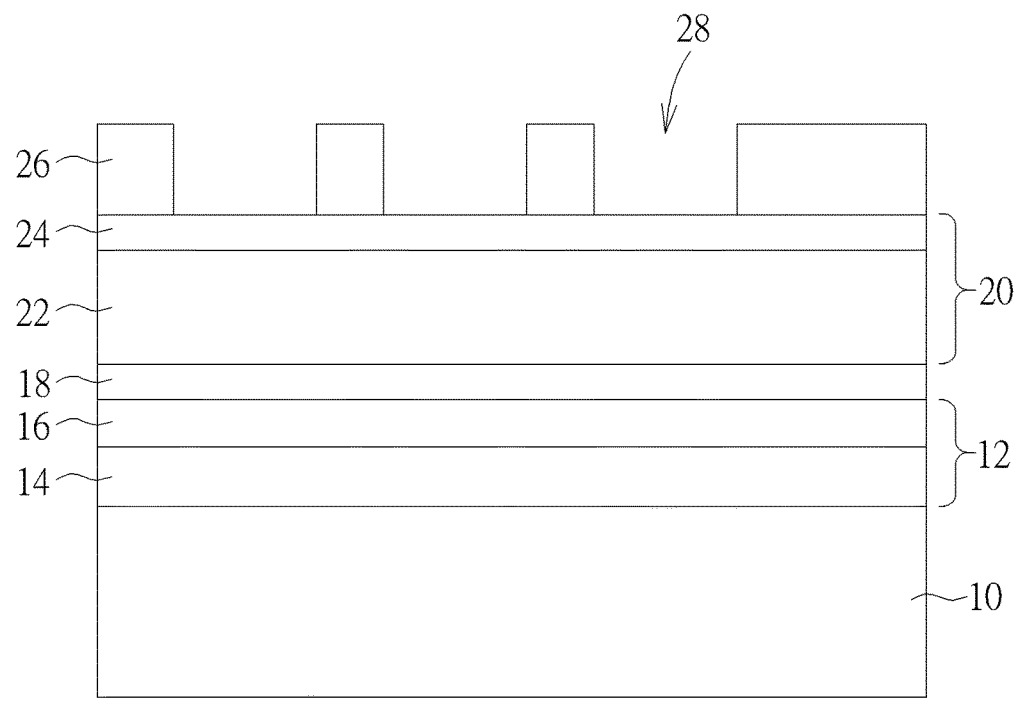

FIG. 1 to FIG. 6 depict a method of fabricating a mask according to a first preferred embodiment of the present invention. As shown in FIG. 1, a substrate 10 is provided. The substrate 10 may be a bulk silicon substrate, a germanium substrate, a gallium arsenide substrate, a silicon germanium substrate, an indium phosphide substrate, a gallium nitride substrate or a silicon carbide substrate. A mask layer 12 covers the substrate 10. The mask layer 12 may be a single-layered material or a multiple-layered material. The mask layer 12 may include silicon oxide, amorphous silicon, silicon nitride, or silicon oxynitride. According to a preferred embodiment of the present invention, the mask layer 12 is a multiple-layered material which is formed by a silicon oxide layer 14 and an amorphous silicon layer 16. A first material layer 18 is formed on the mask layer 12. Then, the first material layer 18 is patterned. The method of patterning the first material layer 18 includes the steps of forming a first mask 20 covering the first material layer 18. The first mask 20 may include an organic dielectric layer (ODL) 22 and a silicon-containing hard mask bottom anti-reflection coating (SHB) 24. Later, a photoresist 26 is formed to cover the first mask 20. Subsequently, the photoresist 26 is patterned to form numerous openings 28 within the photoresist 26. Next, the pattern on the photoresist 26 is transferred to the first mask 20 and the first material layer 18. The method of transferring the pattern may be an etching process. During the stage of transferring the pattern, the pattern of the photoresist 26 is transferred to the SHB 24, the ODL 22 and the first material layer 18 in sequence. The photoresist 26 is entirely consumed after or during the stage of transferring the pattern. At least part of or even the entire SHB 24 is consumed after or during the stage of transferring the pattern.

Figure 2:
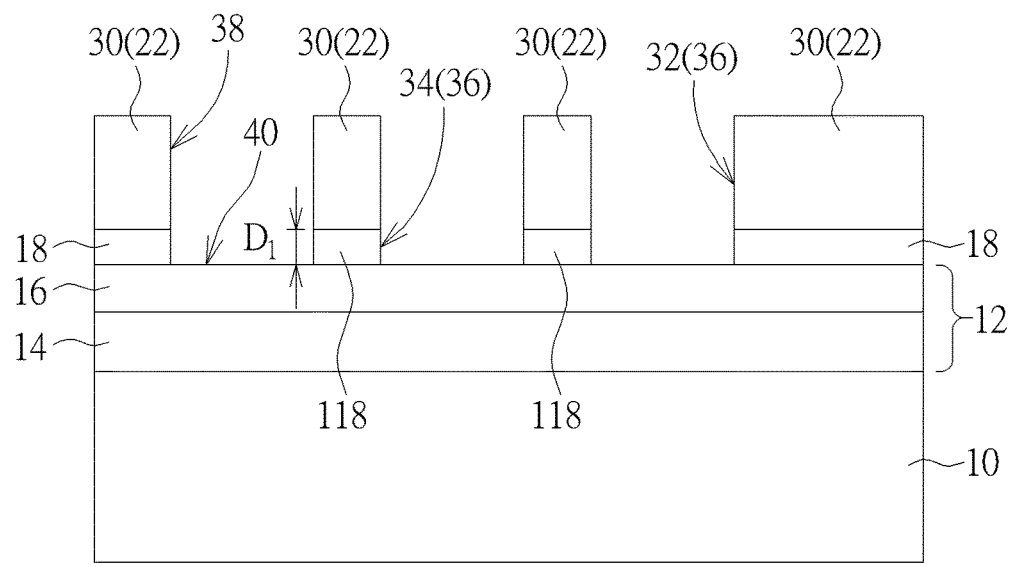

As shown in FIG. 1 and FIG. 2, according to the preferred embodiment of the present invention, when the pattern is transferred into the ODL 22, the entire SHB 24 is consumed. At this point, only the ODL 22 forms the first mask 20. The first mask 20 includes numerous sub-masks 30. A first trench 32 is disposed between sub-masks 30 adjacent to each other. Later, part of the first material layer 18 is etched to remove the first material layer 18. A second trench 34 is formed between part of the first material layer 18 which is not removed. In detail, the first material layer 18 which is not removed forms numerous first material pieces 118 which are disconnected with respect to each other. A second trench 34 is disposed between the adjacent first material pieces 118. The second trench 34 connects to the corresponding first trench 32. The connected first trench 32 and the second trench 34 form a third trench 36. At this point, numerous third trenches 36 are formed. Moreover, the second trench includes a height $D_1$. The third trench 36 includes two sidewalls 38 and a bottom 40.

Figure 3:
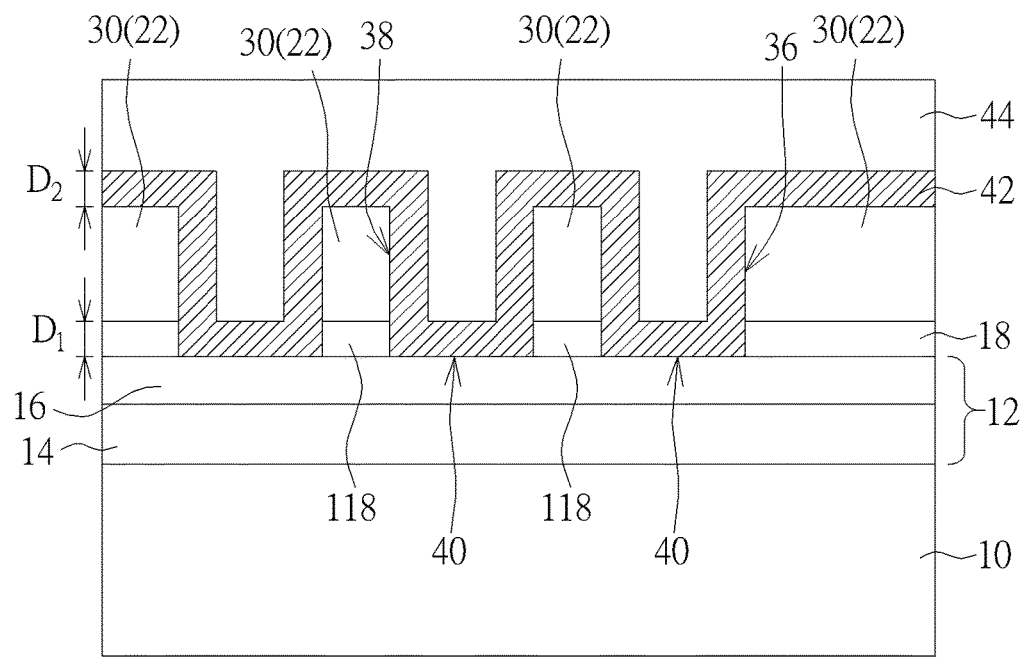
Figure 4:
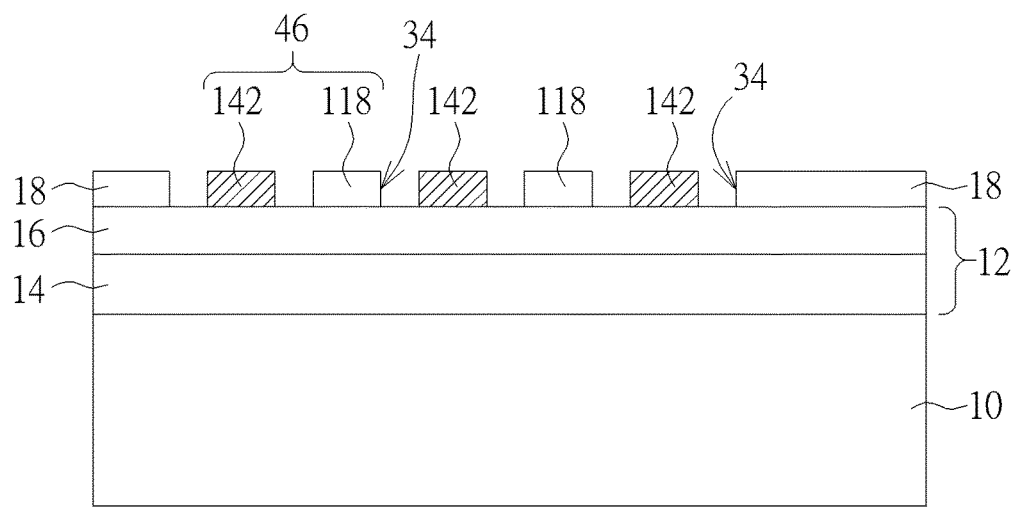

As shown in FIG. 3, a second material layer 42 is conformally formed to fill in the third trench 36 and covers each of the sub-masks 30. It is noteworthy that the second material layer 42 includes a thickness $D_2$. The thickness $D_2$ of the second material layer 42 equals the height $D_1$ of the second trench 34. Moreover, the first material layer 18 is the same as the second material layer 42. The first material layer 18 may include silicon oxide, silicon nitride or silicon oxynitride. For example, the first material layer 18 is silicon oxide and the second material layer 42 is silicon oxide as well. A mask material 44 is formed to cover the second material layer 42 and fills the third trench 36. The mask material 44 may be an organic dielectric layer. The organic dielectric layer of the mask material 44 is preferably made of the same material as the organic dielectric layer 22. Please refer to FIG. 3 with FIG. 4. The mask material 44 and the second material layer 42 are etched until the mask material 44 and the second material layer 42 outside of the third trench 36 are entirely removed. At this point, the height of the third trench 36 is decreased. Next, the second material layer 42 contacting the two sidewalls of the third trench 36 is removed. The second material layer 42 in the second trench 34 and covered by the mask material 44 remains. At this point, the remaining second material layer 42 forms numerous second material pieces 142 which are disconnected with respect to each other. Later, the organic dielectric layer 22 is entirely removed. Each of the second material pieces 142 is within one second trench 34. The second material pieces 142 and the first material pieces 118 form a second mask 46. It is noteworthy that a top surface of each of the second material pieces 142 is aligned with a top surface of each of the first material pieces 118. Moreover, the second material pieces 142 and the first material pieces 118 are arranged alternately. The second material pieces 142 do not connect to the first material pieces 118.

Figure 5:
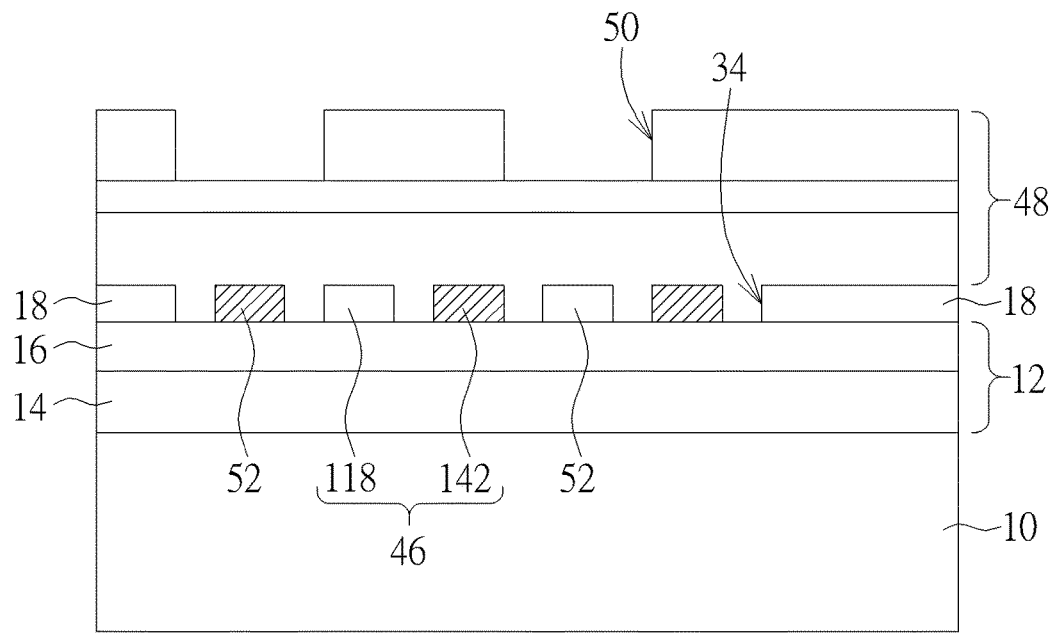
Figure 6:
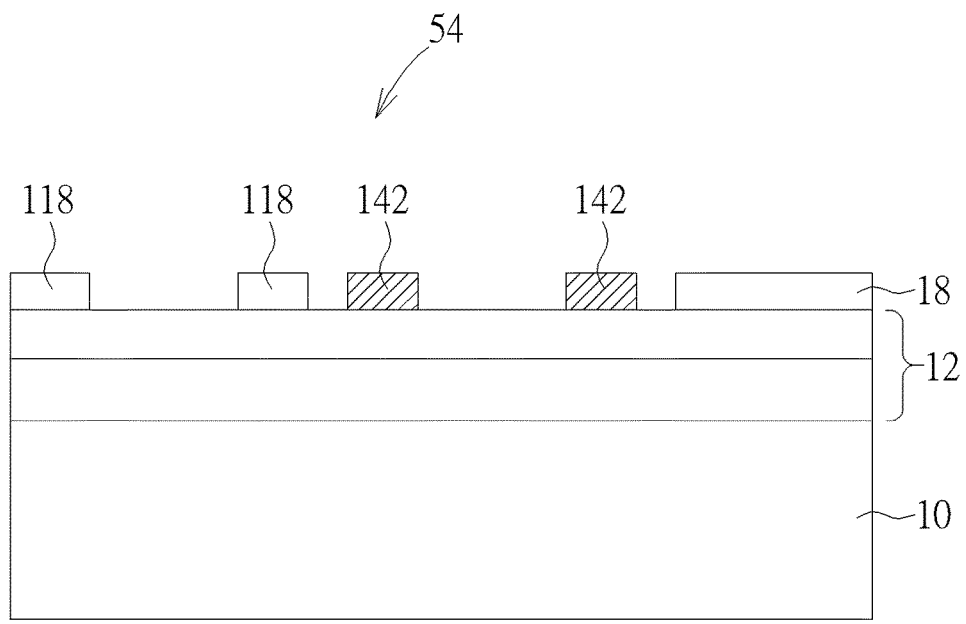

As shown in FIG. 5, a third mask 48 is formed to cover the second mask 46. The third mask 48 includes at least one opening 50. Two openings 50 are shown in FIG. 5 as an example. The position of the openings 50 is used to define the joint area of two shallow trench isolations (STIs) formed afterwards. The second mask 46 directly under the openings 50 is defined as a trench pattern break 52. As shown in FIG. 6, the trench pattern break 52 is removed by using the third mask 48 as a mask to turn the second mask 46 into a fourth mask 54. Later, the third mask 48 is removed. At this point, the fourth mask 54 of the present invention is completed. The fourth mask 54 is formed by the first material pieces 118 and the second material pieces 142. The top surface of the second material pieces 142 aligns with the top surface of the first material pieces 118.

FIG. 1 and FIG. 6 to FIG. 12 depict a method of fabricating a mask according to a second preferred embodiment of the present invention, wherein elements which are substantially the same as those in the first preferred embodiment are denoted by the same reference numerals; an accompanying explanation is therefore omitted. The difference between the first preferred embodiment and the second preferred embodiment is that the first material layer is different from the second material layer in the second preferred embodiment, whereas the first material layer is the same as the second material layer in the first preferred embodiment. Moreover, in the first preferred embodiment, the first material layer is etched to form the second trench before the second material layer is formed. In the second preferred embodiment, the first material layer is not etched before the second material layer is formed.

Figure 7:
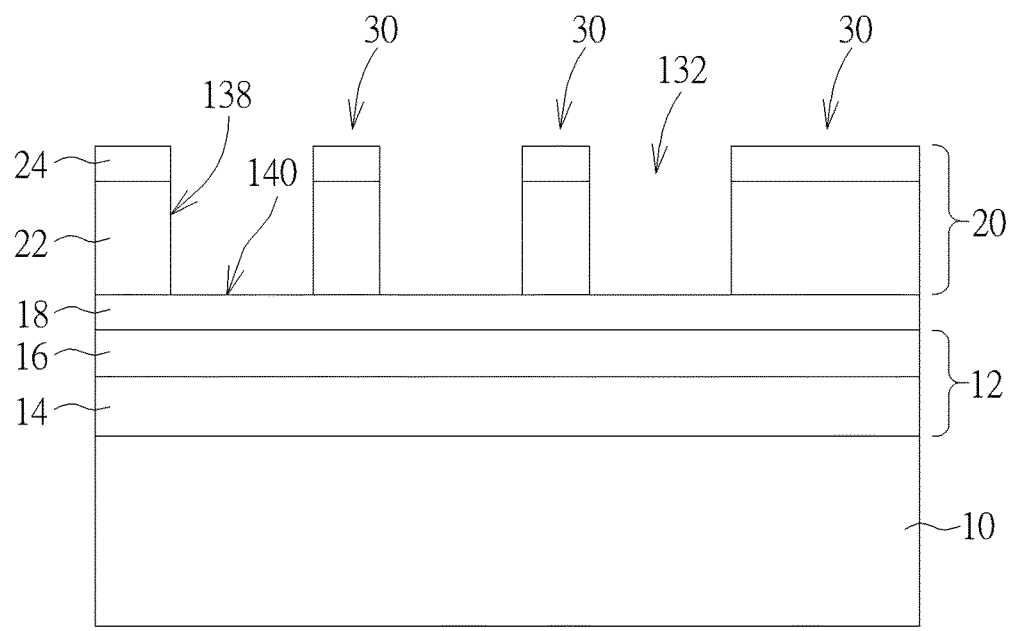

As shown in FIG. 1, a substrate 10 is formed. A mask layer 12 covers the substrate 10. According to a preferred embodiment of the present invention, the mask layer 12 is a multiple-layered material which is formed by a silicon oxide layer 14 and an amorphous silicon layer 16. Then, a first material layer 18 is formed on the mask layer 12. The first mask 20 may include an ODL 22 and an SHB 24. Later, a photoresist 26 is formed to cover the first mask 20. Subsequently, the photoresist 26 is patterned to form numerous openings 28 within the photoresist 26. As shown in FIG. 7, the pattern on the photoresist 26 is transferred to the first mask 20 which thereby forms numerous sub-masks 30 disconnected with respect to each other. The first mask 20 includes the ODL 22 and the SHB 24. A first trench 132 is disposed between adjacent sub-masks 30. The first trench 132 includes two sidewalls 138 and a bottom 140. It is noteworthy that the first material layer 18 is not patterned at this point.

Figure 8:
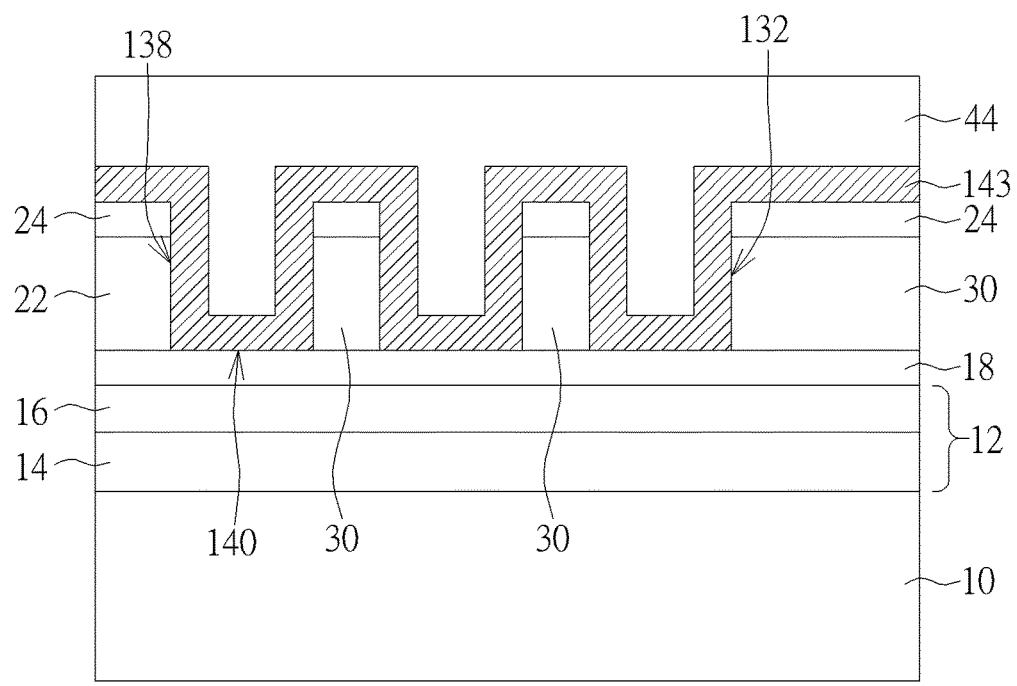

As shown in FIG. 8, a second material layer 143 is formed to fill in the first trench 132 and cover the sub-masks 30. The second material layer 143 is different from the first material layer 18. The first material layer 18 includes silicon oxide, silicon nitride or silicon oxynitride. The second material layer 143 includes silicon oxide, silicon nitride or silicon oxynitride. For example, the first material layer 18 may be silicon oxide. The second material layer 143 may be silicon nitride. Then, a mask material 44 is formed to fill in the first trench 132 and cover the second material layer 143. The mask material 44 may be an organic dielectric layer. The organic dielectric layer of the mask material 44 is preferably made of the same material as the organic dielectric layer 22.

Figure 9:
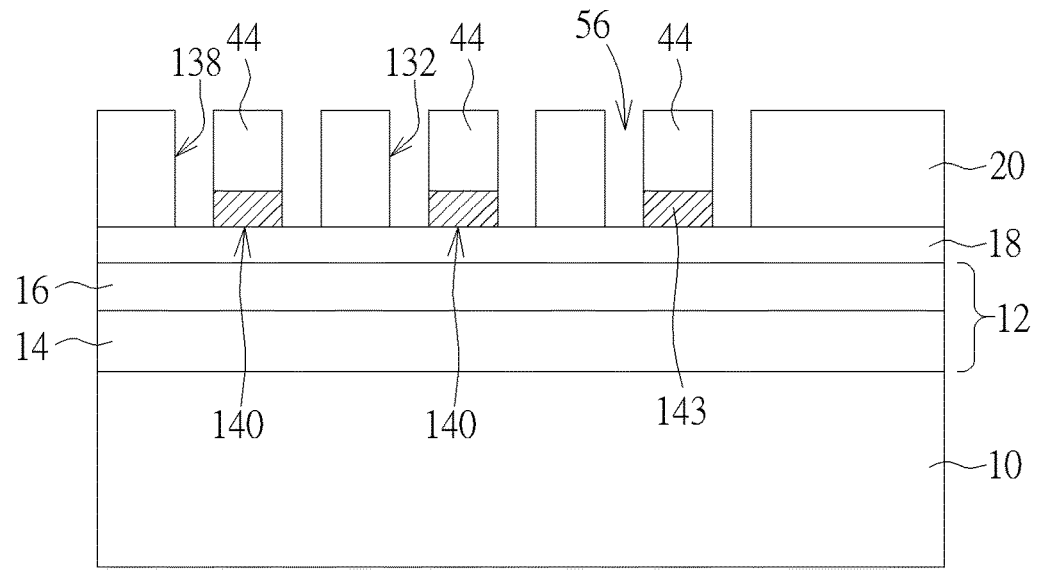
Figure 10:
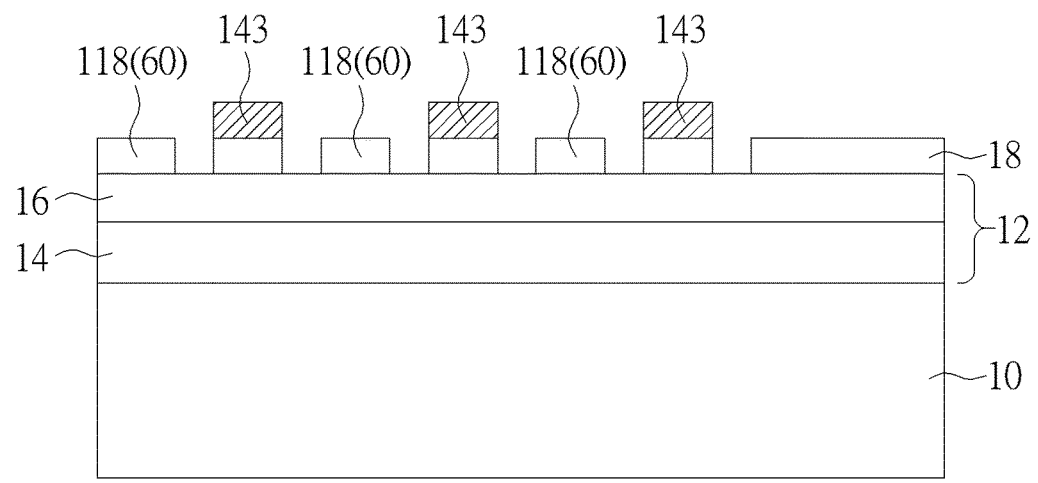

Please refer to FIG. 8 with FIG. 9. The mask material 44 and the second material layer 143 are etched until the mask material 44 and the second material layer 143 outside of the first trench 132 are entirely removed. At this point the SHB 24 may be removed entirely as well, and the height of the first trench 132 is thereby shortened. Next, the second material layer 143 contacting the two sidewalls of the first trench 132 is removed to form numerous second trenches 56. The remaining second material layer 143 covers the bottom of the first trench 132. Please refer to FIG. 9 with FIG. 10. After the trenches 56 are formed, part of the first material layer 18 is removed by using the mask material 44 and the first mask 20 as a mask. At this point, the first material layer 18 which is not removed forms numerous first material pieces 118 which are disconnected with respect to each other. The first material pieces 118 form a second mask 60. Moreover, part of the first material pieces 118 is covered by the remaining second material layer 143.

Figure 11:
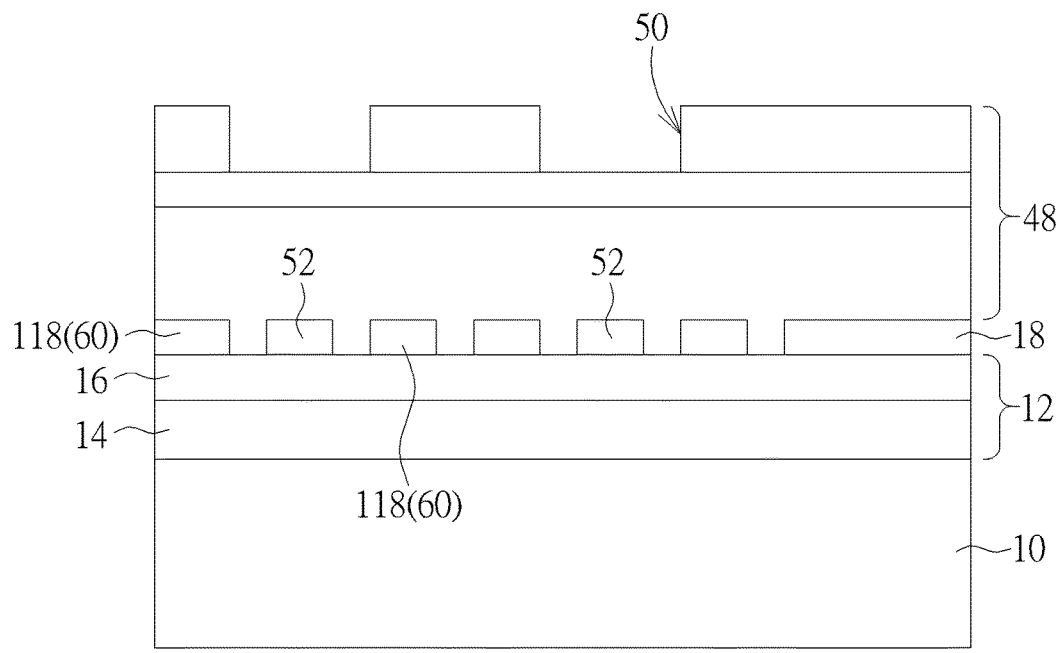
Figure 12:
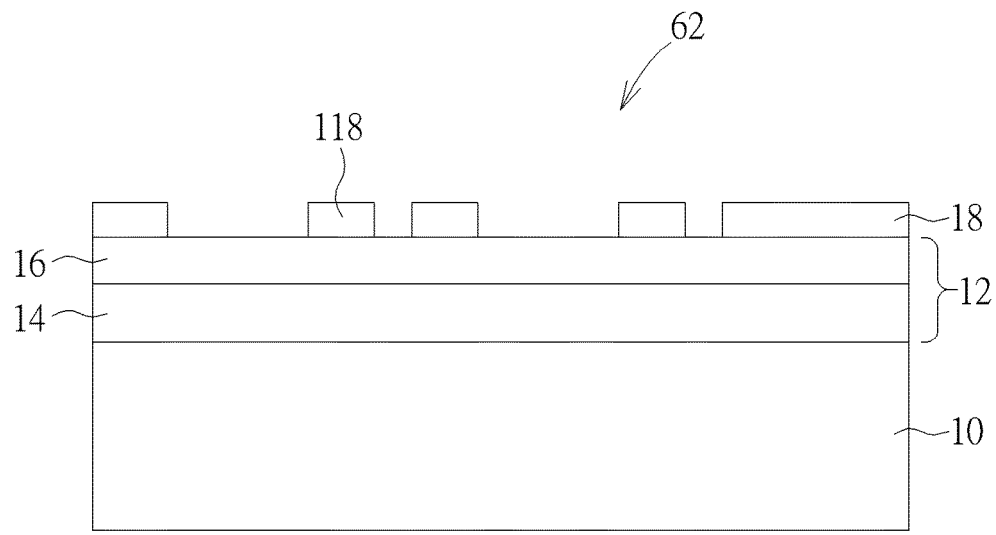

As shown in FIG. 11, the remaining second material layer 143 is removed entirely. Because the second material layer 143 and the first material layer 18 are different, the second material layer 143 can be removed while the first material layer 18 remains by using an etchant with different etching ratios from the second material layer 143 and the first material layer 18. In this way, the second material layer 143 can be removed while the first material pieces 118 remains, as the first material pieces 118 are made of the first material layer 18. Next, a third mask 48 is formed to cover the second mask 60. The third mask 48 includes at least one opening 50. Two openings 50 are shown in FIG. 11 as an example. The second mask 60 directly under the openings 50 is defined as a trench pattern break 52. As shown in FIG. 12, the trench pattern break 52 is removed by using the third mask 48 as a mask to turn the second mask 60 into a fourth mask 62. At this point, the fourth mask 62 of the present invention is completed. The fourth mask 62 is formed by the first material pieces 118. The top surface of each of the first material pieces 118 are aligned with each other.

Figure 13:
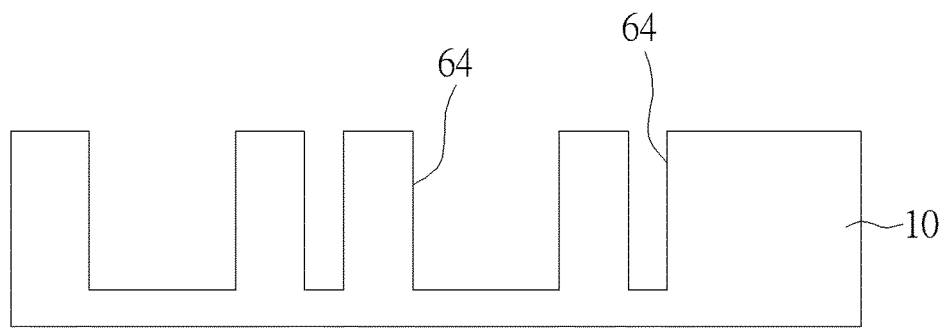
FIG. 13 shows a STI trench fabricated by a mask layer of the present invention.

As shown in FIG. 13, the fourth mask 54 of the first preferred embodiment or the fourth mask 62 of the second preferred embodiment is used as a mask to remove part of the substrate 10 and form numerous shallow trench isolation (STI) trenches 64 in the substrate 10. The substrate 10 is preferably removed by a dry etching. In detail, while forming the STI trenches 64, the mask layer 12 is etched first by using the fourth mask 54 or the fourth mask 62 as a mask. The substrate 10 then continues to be etched. During this process, the mask layer 12 is thinned, or even entirely consumed. After the STI trenches 64 are completed, if some mask layer 12 remains, the mask layer 12 can be removed by a wet etching by using the dilute hydrofluoric acid as an etchant. In addition, the STI trench 64 with a narrower opening will become an STI after being filled with an insulating material, and the STI trench 64 with a wider opening will become a joint STI after being filled with an insulating material. The joint STI is used to connect two adjacent STIs.

Figure 14:
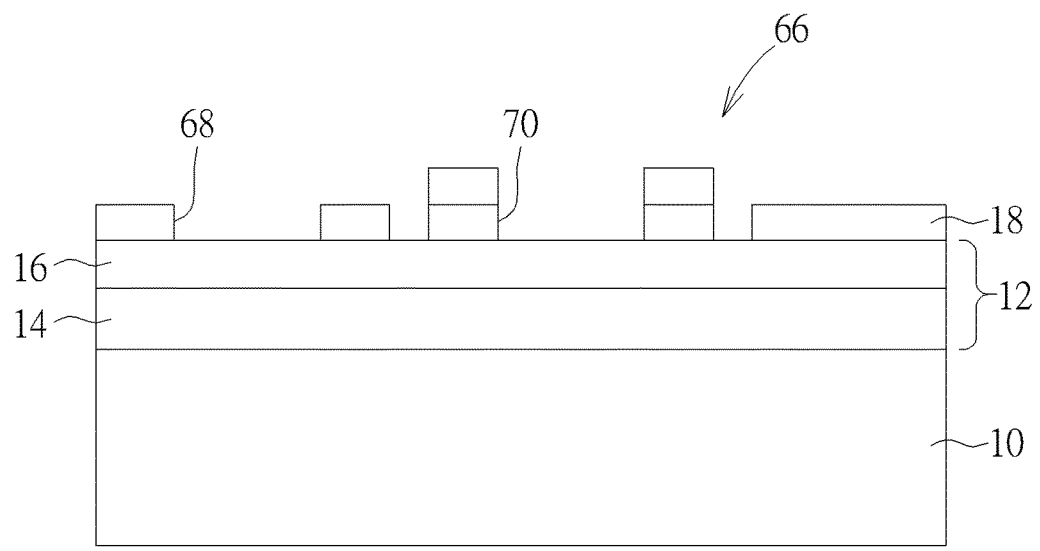
FIG. 14 depicts a mask layer with an uneven top surface.

The mask layer formed by using the method of the present invention will not become the mask layer 66 with an uneven top surface as shown in FIG. 14. The mask layer 66 has the following disadvantages: when the opening 68 and the opening 70 have the same width, the STI formed by the opening 70 will have a smaller opening, and the STI formed by the opening 68 will have a wider opening because the sidewall of the opening 70 is higher than the sidewall of the opening 68. The mask layer of the present invention has an even top surface; therefore, the width of the STIs formed by the openings with the same size on the mask layer will have the same size.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of fabricating a mask, comprising:
   providing a substrate, wherein a first material layer is disposed on the substrate;
   forming a first mask to cover the first material layer, wherein the first mask comprises a plurality of sub-masks, and a first trench is disposed between the sub-masks adjacent to each other;
   removing part of the first material layer by using the first mask as a first protective mask to form a second trench between the part of the first material layer which is not removed, wherein the second trench and the first trench form a third trench, the second trench has a height, and the third trench has two sidewalls and a bottom;
   forming a second material layer to conformally fill in and contact the third trench, wherein the second material layer comprises a thickness, and the thickness equals the height of the second trench;
   removing the second material layer contacting the sidewalls of the third trench, wherein the second material layer which is not removed and the first material layer which is not removed form a second mask;
   after forming the second mask, forming a third mask covering the second mask, wherein the third mask comprises an opening, and the second mask disposed directly under the opening is defined as a trench pattern break;
   removing the trench pattern break by using the third mask as a second protective mask to turn the second mask into a fourth mask;
   removing the third mask; and
   removing part of the substrate by using the fourth mask as a third protective mask to form a plurality of shallow trench isolation trenches.

2. The method of fabricating a mask of claim 1, wherein the first material layer is formed of the same material as the second material layer.

3. The method of fabricating a mask of claim 2, wherein the first material layer comprises silicon oxide, silicon nitride or silicon oxynitride.

4. The method of fabricating a mask of claim 1, wherein after removing the second material layer contacting the sidewalls of the third trench, the top surface of the second material layer which is not removed aligns with a top surface of the first material layer which is not removed.

5. A method of fabricating a mask, comprising:
   providing a substrate, wherein a first material layer covers the substrate;
   forming a first mask to cover the first material layer, wherein the first mask comprises a plurality of sub-masks, a first trench is disposed between the sub-masks adjacent to each other, and the first trench comprises two sidewalls and a bottom;
   forming a second material layer to conformally fill the first trench, wherein the second material layer is different from the first material layer;
   forming a mask material filling the first trench;
   removing the second material layer contacting the sidewalls of the first trench to form a plurality of second trenches, wherein the second material layer which is not removed covers the bottom of the first trench;
   after forming the second trenches, removing part of the first material layer by using the mask material and the first mask as a first protective mask to form a second mask;
   removing the mask material and the first mask;
   removing the second material layer entirely;
   after forming the second mask, forming a third mask covering the second mask, wherein the third mask comprises an opening, and the second mask disposed directly under the opening is defined as a trench pattern break;

removing the trench pattern break by using the third mask as a second protective mask to turn the second mask into a fourth mask;

removing the third mask; and removing part of the substrate by using the fourth mask as a third protective mask to form a plurality of shallow trench isolation trenches.

6. The method of fabricating a mask of claim 5, wherein the second material layer is silicon nitride and the first material layer is silicon oxide.

7. The method of fabricating a mask of claim 5, wherein the second material layer is silicon oxide and the first material layer is silicon nitride.

* * * * *